United States Patent [19]
Okuda et al.

[11] Patent Number: 6,000,862
[45] Date of Patent: Dec. 14, 1999

[54] SUBSTRATE DEVELOPING METHOD AND APPARATUS

[75] Inventors: Seiichiro Okuda; Kenji Sugimoto, both of Kyoto, Japan

[73] Assignee: Dainippon Screen Mfg. Co. Ltd., Japan

[21] Appl. No.: 08/725,846

[22] Filed: Oct. 4, 1996

[30] Foreign Application Priority Data

Oct. 12, 1995 [JP] Japan .................................. 7-291963

[51] Int. Cl.⁶ .............................. G03D 7/00; G03D 5/00
[52] U.S. Cl. ........................ 396/579; 396/611; 396/627
[58] Field of Search .................................. 396/611, 626, 396/627, 579, 571; 118/666, 52, 326, 64, 630; 427/240; 355/53, 77; 156/245

[56] References Cited

U.S. PATENT DOCUMENTS

| | | | |
|---|---|---|---|
| 5,143,552 | 9/1992 | Moriyama | 118/666 |
| 5,658,615 | 8/1997 | Hasebe et al. | 427/240 |

FOREIGN PATENT DOCUMENTS

| | | | |
|---|---|---|---|
| 260823 | 10/1989 | Japan | 396/FOR 936 |
| 234321 | 11/1989 | Japan | 396/FOR 936 |
| 13959 | 1/1990 | Japan | 396/FOR 936 |

*Primary Examiner*—D. Rutledge
*Attorney, Agent, or Firm*—Ostrolenk, Faber, Gerb & Soffen, LLP

[57] ABSTRACT

A substrate developing method and apparatus for improving uniformity of a developing process by adjusting a temperature gradient of a developer spread over the surface of a substrate. The developer is delivered to a central region of the substrate surface and spread over the surface. The developer in this state has activity diminishing, and thereby lowering the developing rate, gradually from center to edge of the substrate. With a gas flowing down around the edge of the substrate during the developing process, the developer vaporizes from peripheral regions of the substrate at an increased rate, thereby lowering the developer temperature in the peripheral regions. This increases the developing rate gradually from edge to center of the substrate. The uniformity of the developing process is improved by balancing the gradient of developing rate due to the temperature variation of the developer against the gradient of developing rate due to the lowering of developer activity.

9 Claims, 9 Drawing Sheets

SUBSTRATE DEVELOPING METHOD AND APPARATUS

BACKGROUND OF THE INVENTION (1) Field of the Invention

This invention relates to a method and an apparatus for developing photoresist film patterns on substrates such as semiconductor wafers, glass substrates for liquid crystal displays, glass substrates for photomasks, and substrates for optical disks. More particularly, the invention relates to a technique of developing film patterns (in what is called puddle development) with a developer spread and retained on substrates utilizing the surface tension thereof.

(2) Description of the Related Art

FIG. 1 shows an apparatus of the type noted above. A conventional developing technique will be described with reference to this figure.

In FIG. 1, reference W denotes a substrate such as a semiconductor wafer, an upper surface thereof being formed with a photoresist film having a predetermined thickness and a predetermined pattern printed and exposed thereon. The wafer W is suction-supported in a substantially horizontal position on a spin chuck 1. The spin chuck 1 is surrounded by a scatter preventive cup 4 for collecting a developer and the like. The scatter preventive cup 4 includes, disposed in lower positions thereof, drain ports 8 for draining used developer and the like, and exhaust ports 10 for exhausting a gas including mist of the developer scattering within the cup 4. A cylindrical wall 13 is continuous with an upper end of the scatter preventive cup 4 for preventing the odor of the developer and the like from diffusing to the ambient. The apparatus further includes a nozzle 16 for supplying the developer to the vicinity of the spin center of wafer W.

With the apparatus having the above construction, when the wafer W is suction-supported on the spin chuck 1, developer L is delivered from the nozzle 16 to make puddle the wafer W. A developing process takes place in this state. Upon completion of development, the spin chuck 1 is driven to spin at a high speed to spread the developer from the wafer W. At the same time, a different nozzle, not shown, is moved to a position above the wafer W to jet out a cleaning liquid, such as deionized water, for cleaning the wafer W. The wafer W is maintained in the spinning state for a fixed time after stopping the cleaning liquid. As a result, the wafer W is stripped of the cleaning liquid supplied thereto, and is allowed to dry.

During this developing process, down-ward flows of clean air DF in the cleanroom in which the developing apparatus is installed are taken into the scatter preventive cup 4 through an upper opening of the cylindrical wall 13, and forcibly exhausted through the exhaust ports 10 in the lower positions of the scatter preventive cup 4. These downflows DF prevent the odor of the developer from diffusing outside the apparatus, and mist of the developer and the like generated in the scatter preventive cup 4 from adhering to the upper surface of wafer W.

The conventional apparatus having the above construction has the following disadvantages.

During the developing process with the developer spread over the wafer W, the conventional apparatus takes downflows DF into the scatter preventive cup 4 and exhausts the downflows through the lower positions thereof. Consequently, gas flows downward around the edge of wafer W during the developing process, whereby the developer vaporizes at a higher rate from adjacent the edge of the wafer than from a central region of the wafer. The part of the developer adjacent the wafer's edge gives up a high heat of vaporization. As a result, peripheral regions of the wafer become cooler than the central region thereof, with a sharp temperature gradient from center to edge (i.e. lowering toward the edge). Thus, the conventional apparatus has the disadvantage of producing uneven developing (i.e. non-uniformity in the line width of a pattern developed). Specifically, where the temperature of the developer is around 23° C., the developer temperature and an average line width of the developed pattern are in a relationship of approximately 0.01 $\mu$m/°C. The lower the temperature, the thinner the line width of the pattern tends to be (with the higher rate of development). Thus, this uneven developing results mainly in the line width of the pattern becoming gradually thinner from the center to the edge of wafer W.

To avoid such uneveness in developing, the temperature gradient may be eliminated by stopping the gas exhaust from the scatter preventive cup 4 during the developing process. However, this measure will bring about the following inconvenience.

The region of wafer W directly under the nozzle 16, e.g. the central region of wafer W, constantly receives a fresh supply of the developer from nozzle 16. Consequently, the part of the photoresist film in the central region is in constant contact with the developer having high activity. On the other hand, the peripheral regions of wafer W receive the developer spread from the central region. The developer reacts with the photoresist film while spreading from the central region to the peripheral regions, and its effectiveness has been reduced by the time the developer reaches the peripheral regions and acts on the photoresist film. That is, the effectiveness of the developer lowers gradually from the central region to the peripheral regions of the wafer. As a result, the developed pattern has a thinner line width in the central region than in the peripheral regions. In other words, an uneveness in developing occurs from a different cause that development progresses at a higher rate in the central region than in the peripheral regions.

SUMMARY OF THE INVENTION

This invention has been made having regard to the state of the art noted above, and its object is to provide a substrate developing method and apparatus for adjusting a temperature gradient of a developer on a substrate to improve the uniformity of development over the substrate surface.

The above object is fulfilled, according to this invention by a substrate developing method for developing a photoresist film formed on a surface of a substrate with a developer spread over the surface of the substrate supported in horizontal posture, the method comprising a developer supplying step for supplying the developer to the surface of the substrate and spreading the developer thereon, and a developing step for developing the photoresist film while causing a gas to flow in an adjusted quantity down around an edge of the substrate, at least after the developer is spread on the surface of the substrate.

In the method according to this invention, the quantity of the developer vaporizing from peripheral regions of the substrate is varied by adjusting the quantity of gas flowing down around the edge of the substrate during a process called puddle development. Consequently, a temperature gradient from center to periphery of the substrate may be adjusted as desired to improve the uniformity of development over the substrate surface.

Specifically, where the developer is supplied to a central region of the surface of the substrate and spread over the surface in the developer supplying step, the gas is caused to flow down in a less quantity in the developing step than in the developer supplying step.

This flow adjustment suppresses the temperature drop of the developer in peripheral regions of the substrate to diminish the temperature difference with respect to the central region. That is, the temperature gradient from the central region to the peripheral regions becomes gentle (i.e. the developer temperature lowers gently toward the peripheral regions). As a result, the developing rate increases gradually and gently from the central region to the peripheral regions of the substrate. On the other hand, the developer supplied to the central region of the substrate in the developer supplying step has the highest degree of activity in the central region, with the activity diminishing gradually toward the peripheral regions. Thus, the developing rate is the highest in the central region, and lowers gradually and gently toward the peripheral regions. As noted above, the quantity of gas flowing down around the edge of the substrate is adjusted (decreased) so that the temperature gradient of the developer lowers gently toward the edge. This causes the developing rate due to the developer temperature to increase gradually and gently toward the peripheral regions. On the other hand, the developing rate due to the developer activity decreases gradually and gently toward the peripheral regions. By striking a balance between these changes, the developing rate may be made substantially constant from the central region to the peripheral regions of the substrate. As a result, the pattern line width may be uniformed over the substrate surface, with an improved uniformity of development.

In a preferred mode of adjusting the quantity of gas flowing down around the edge of the substrate, a physical quantity relating to the quantity of gas downflow, e.g. a pressure or velocity of downflow, is measured, and the quantity of gas downflow is adjusted by a feedback control so that the physical quantity agrees with a predetermined value. This predetermined value is a value of a physical quantity relating to the quantity of the gas flowing down, for uniforming a developing rate from center to edge of the substrate. Such a value may be determined empirically or otherwise in advance.

In a further aspect of the invention, there is provided a substrate developing apparatus for developing a photoresist film formed on a surface of a substrate with a developer spread over the surface of the substrate supported in horizontal posture, the apparatus comprising a substrate supporting device for supporting the substrate substantially in horizontal posture, a developer supplying device for supplying the developer to the surface of the substrate, a scatter preventive cup surrounding the substrate supporting device, and a flow adjusting device for adjusting quantity of a gas flowing down around an edge of the substrate at least during a developing process with the developer spread on the surface of the substrate.

Specifically, the flow adjusting device includes a cup exhaust structure for exhausting, downwardly from above the substrate, a gas including mist of the developer scattering inside the scatter preventive cup, a detecting device for detecting a physical quantity relating to the quantity of the gas flowing down around the edge of the substrate, and a control device for adjusting a quantity of exhaust through the cup exhaust structure based on a detection value provided by the detecting device, at least during the developing process with the developer spread on the surface of the substrate.

With the flow control device having the above construction, the quantity of exhaust is controlled based on a detection value provided by the detecting device, which realizes an exhaust adjustment with increased precision. The quantity of exhaust may be maintained constant even when, for example, mist and particles of the developer adhere to inner walls of the cup exhaust structure to reduce a sectional area of passages. Consequently, the improved uniformity of development over the substrate surface may be maintained over a long period of time.

Preferably, the apparatus according to this invention further comprises an upper exhaust structure disposed above the substrate supporting device. In this case, the control device, preferably, is operable to decrease a quantity of exhaust through the upper exhaust structure when increasing the quantity of exhaust through the cup exhaust structure, and to increase the quantity of exhaust through the upper exhaust structure when decreasing the quantity of exhaust through the cup exhaust structure. With the above control, exhaust through the upper exhaust structure is promoted when the quantity of exhaust through the cup exhaust structure is small, thereby to prevent the odor of the developer from leaking to the ambient.

BRIEF DESCRIPTION OF THE DRAWINGS

For the purpose of illustrating the invention, there are shown in the drawings several forms which are presently preferred. It is understood, however, that the invention is not limited to the precise arrangements and instrumentalities shown.

DESCRIPTION OF THE PREFERRED EMBODIMENT

A preferred embodiment of the present invention will be described in detail hereinafter with reference to the drawings.

Figure 1:
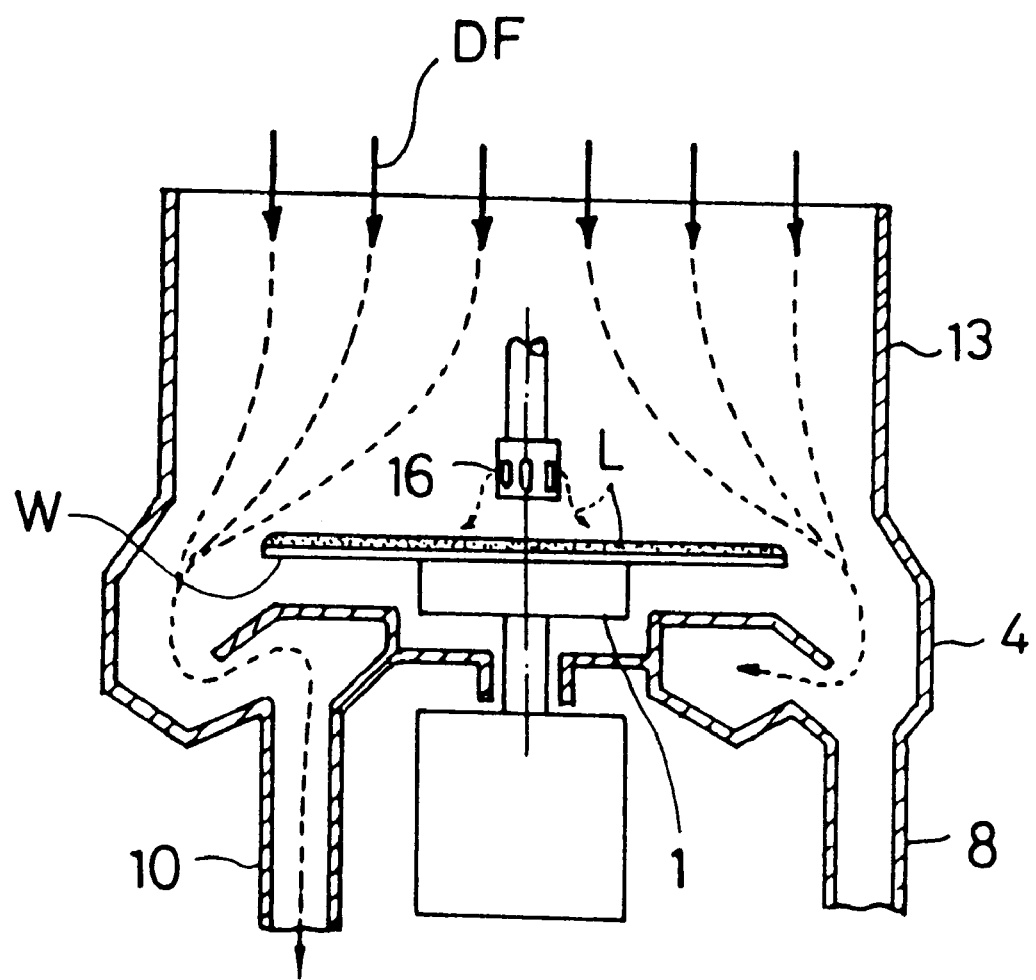
FIG. 1 is a vertical cross section showing an outline of a conventional substrate developing apparatus.
Figure 2:
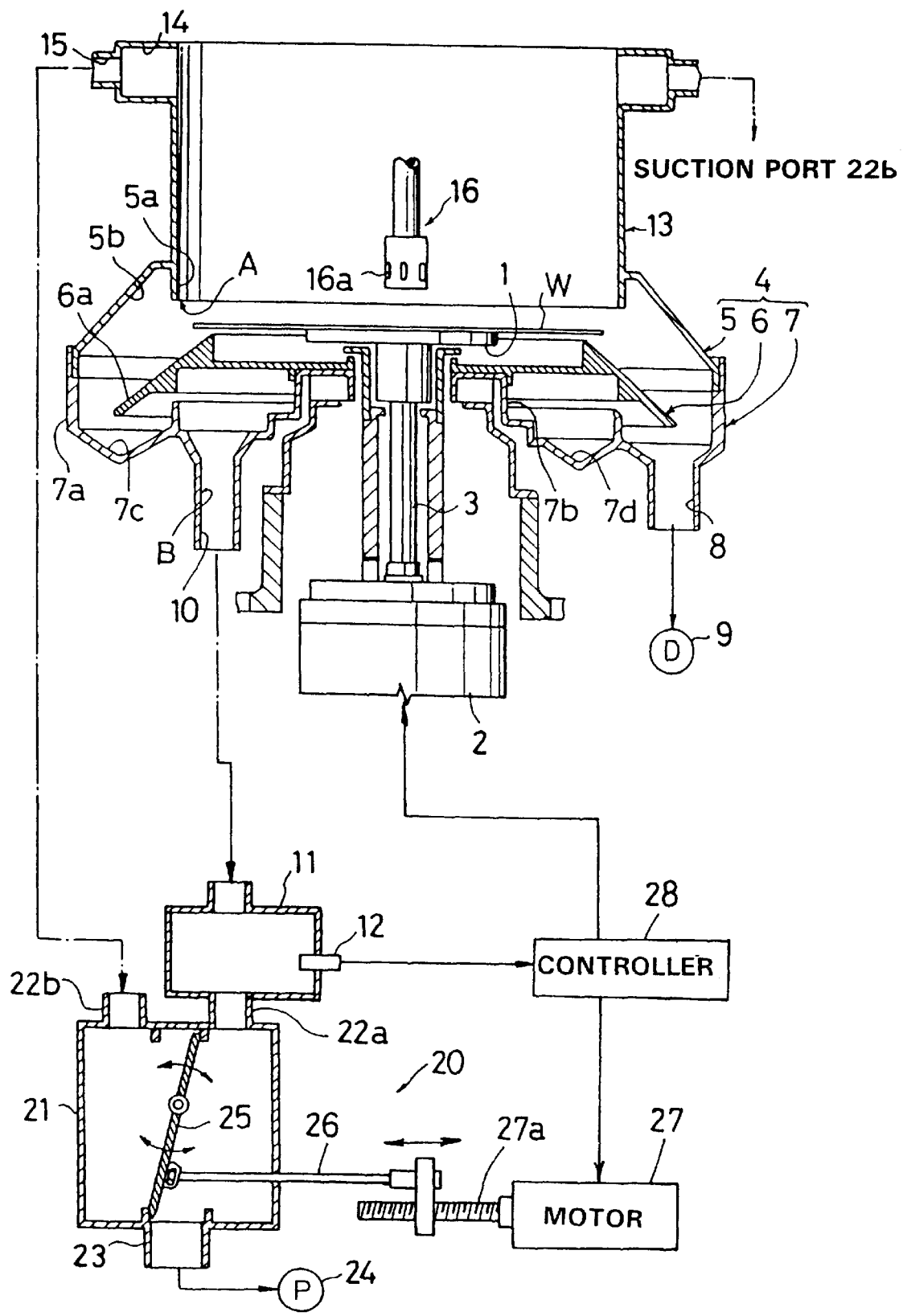
FIG. 2 is a vertical cross section of a substrate developing apparatus according to the present invention.

FIG. 2 is a view in vertical cross section showing a principal portion of a substrate developing apparatus according to this invention.

In FIG. 2, numeral 1 denotes a suction type spin chuck for suction-supporting a substrate W, such as a semiconductor wafer, in a substantially horizontal position so as to be subjected to a developing process. The spin chuck 1 is interlocked to a hollow rotary shaft 3 acting as an output shaft of a rotary motor 2. The spin chuck 1 is surrounded by a scatter preventive cup 4 which prevents the scattering of a developer as it is spun on substrate W, and which also collects the developer.

The scatter preventive cup 4 includes an upper cup 5, a baffle disk 6 and a lower cup 7. The upper cup 5 defines an upper opening 5a, and a slant surface 5b for downwardly guiding the developer scattered from the spinning substrate W. The upper cup 5 is fitted in an upper end of an outer peripheral wall 7a of the lower cup 7.

The baffle disk 6 is fitted on an upper end of an inner peripheral wall 7b of the lower cup 7 to lie under the spin chuck 1. The baffle disk 6 defines a slant surface 6a for straightening and guiding air flows entering through the opening 5a and descending round the edge of substrate W into the lower cup 7. The sprays (mist) of the developer guided downward by the slant surface 5b of upper cup 5 are entrained by these air flows to enter the lower cup 7.

The lower cup 7 includes an annular drainage zone 7c inscribing a lower end of the outer peripheral wall 7a, and an annular gas exhaust zone 7d formed inwardly of the drainage zone 7c. A pair of drain ports 8 are formed in lower positions of the drainage zone 7c and opposed to each other across the substrate W in plan view, but only one of the drain ports is shown in FIG. 2 for expediency of illustration. The drain ports 8 are connected to a drainage tank 9 for collecting the developer used in the developing process and other liquids. The gas exhaust zone 7d has exhaust ports 10 formed in three bottom positions thereof at equal angular displacement around the substrate W, but only one of the exhaust ports is shown in FIG. 2 for expediency of illustration. The three exhaust ports 10 are connected to an exhaust box 11. The exhaust box 11 has a manometer 12 attached thereto for detecting a pressure (negative pressure) produced by the gas flowing into the box 11. The exhaust box 11 communicates with an exhaust adjusting unit 20 which will be described hereinafter. The pressure (negative pressure) detected by the manometer 12 is a physical quantity relating to a quantity of gas flowing down around the edge of substrate W. The closer the negative pressure is to zero, the less quantity of gas flows down around the edge of substrate W. Thus, when the negative pressure is zero, there is no gas downflow around the edge of substrate W. The manometer 12 corresponds to the detecting device of this invention.

A cylindrical wall 13 is continuous with an upper end of the upper cup 5 and surrounds the opening 5a to prevent diffusion of the odor of the developer. The cylindrical wall 13 includes an annular exhaust zone 14 protruding from an upper outer periphery thereof. The exhaust zone 14 has a pair of upper exhaust ports 15 arranged opposite each other. These upper exhaust ports 15 are connected to the exhaust adjusting unit 20 described hereinafter.

A developer dispensing nozzle 16 is disposed inside the cylindrical wall 13 and above the spin center of substrate W. The developer dispensing nozzle 16 is movable between a dispensing position above the spin center of the spin chuck 1, and a retracted position for allowing for the conveyance of substrate W into and out of the apparatus. The developer dispensing nozzle 16 has developer outlets 16a formed in a lower peripheral wall thereof for gently delivering the developer onto the substrate W.

An exhaust adjusting unit 20 includes a box 21 defining two exhaust passages with continuously variable flow rates therethrough. The box 21 has an upper wall defining two intake ports 22a and 22b, and a lower wall opposed to the upper wall and defining an exhaust port 23 common to the two intake ports 22a and 22b. One of the intake ports 22a communicates with the exhaust box 11 connected to the exhaust ports 10 of the scatter preventive cup 4. The other intake port 22b is connected to the upper exhaust ports 15 on the cylindrical wall 11. The exhaust port 23 of the box 21 is connected to an exhaust pump 24. The box 21 contains a swing plate 25 pivotally supported therein for adjusting the two exhaust passages. The box 21 further includes a push-pull rod 26 having one end thereof connected to a position of the swing plate 25 below a pivotal axis thereof. The other end of the push-pull rod 26 is meshed with a screw shaft 27a of a motor 27. The rod 26 is movable back and forth relative to the interior of the box 21 with rotation of the motor 27. The motor 27 is rotatable under control of a controller 28.

The controller 28 has an internal memory, not shown, for storing a program prepared for the developing process, which is also referred to as a recipe for the developing process. Based on the recipe, the controller 28 carries out an overall control operation to control a substrate transport mechanism, not shown, for transporting substrates W into and out of the apparatus the rotary motor 2 for spinning substrates W a moving mechanism, not shown, for moving the developer dispensing nozzle 16 between the dispensing position and retracted position delivery of the developer through the developer dispensing nozzle 16 and the exhaust adjusting unit 20. Further, as described in detail hereinafter, the controller 28, based on the recipe for development, reads a pressure level detected by the manometer 12, and controls the exhaust adjusting unit 20 for causing the gas to flow at a reduced rate down around the edge of substrate W. This occurs at least during the developing process with the developer spread and retained on the substrate W, so that the flow rate is less than when the developer is supplied to the substrate W.

The cup's exhaust ports 10, exhaust box 11, exhaust adjusting unit 20 and controller 20 constitute the flow adjusting device of this invention. The cup's exhaust ports 10 and exhaust box 11 constitute the exhaust structure of this invention. The exhaust adjusting unit 20 and controller 28 constitute the control device of this invention.

Figures 3A, 3B:
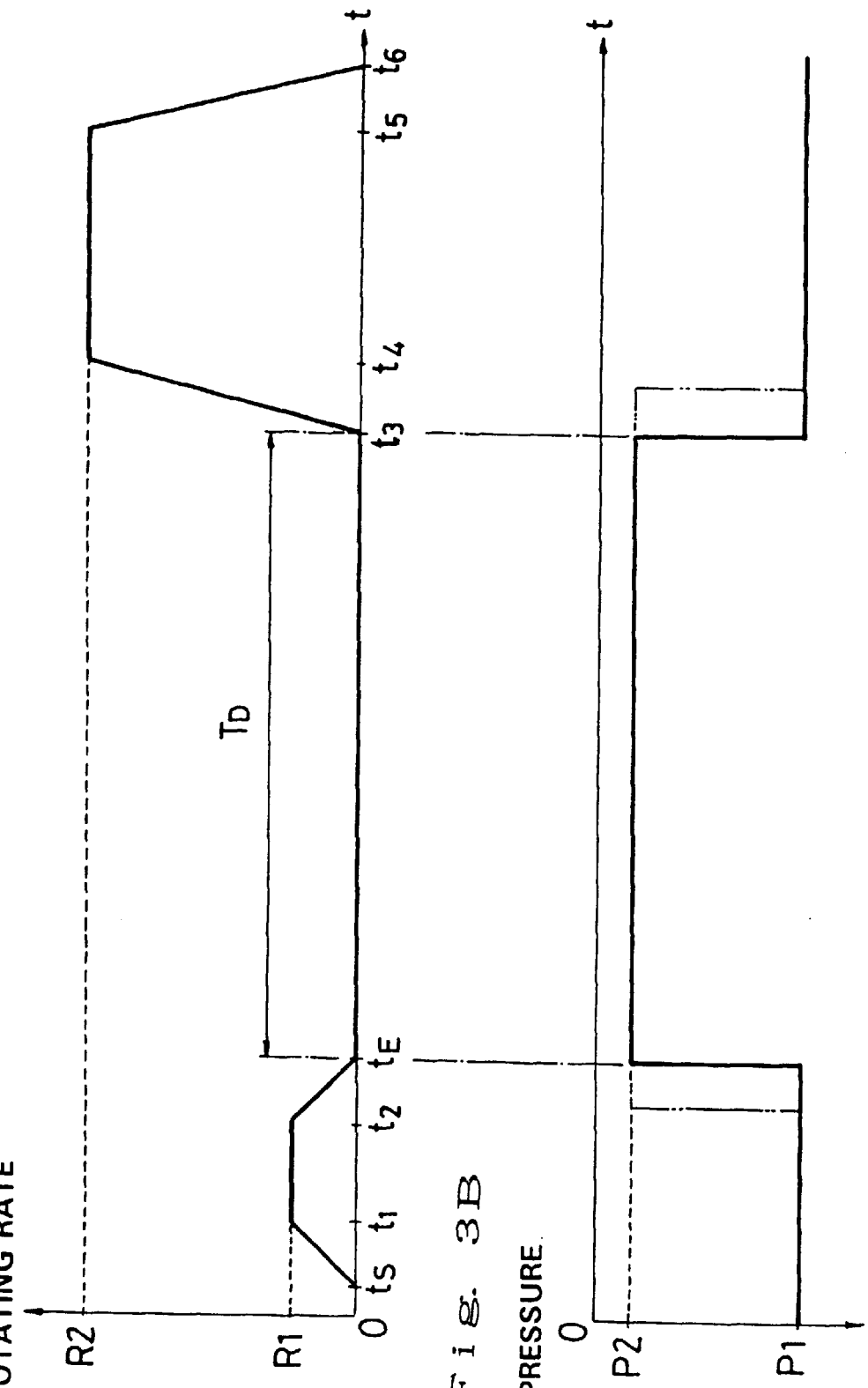
FIGS. 3A and 3B are time charts of a developing process.

An operation of the above apparatus will be described with reference to the time chart shown in FIGS. 3A and 3B which exemplifies a recipe for development. FIG. 3A shows rotating rates of the rotary motor 2, while FIG. 3B shows pressure levels detected by the manometer 12.

The following description will be made on the assumption that substrate W to be processed (i.e. having a photoresist film formed on the surface, with a pattern printed through an exposing process) has been introduced by the transport mechanism not shown, and suction-supported on the spin chuck 1, and that the developer dispensing nozzle 16 has been moved to the dispensing position above the spin center of substrate W by the moving mechanism not shown. It is further assumed that the controller 28 has controlled the motor 27 to advance the rod 26 deep into the box 21, thereby to swing the swing plate 25 clockwise, so that the pressure in the exhaust box 11 detected by the manometer 12 is at a fixed value P1 (e.g. −20 mm $H_2O$).

Figure 4:
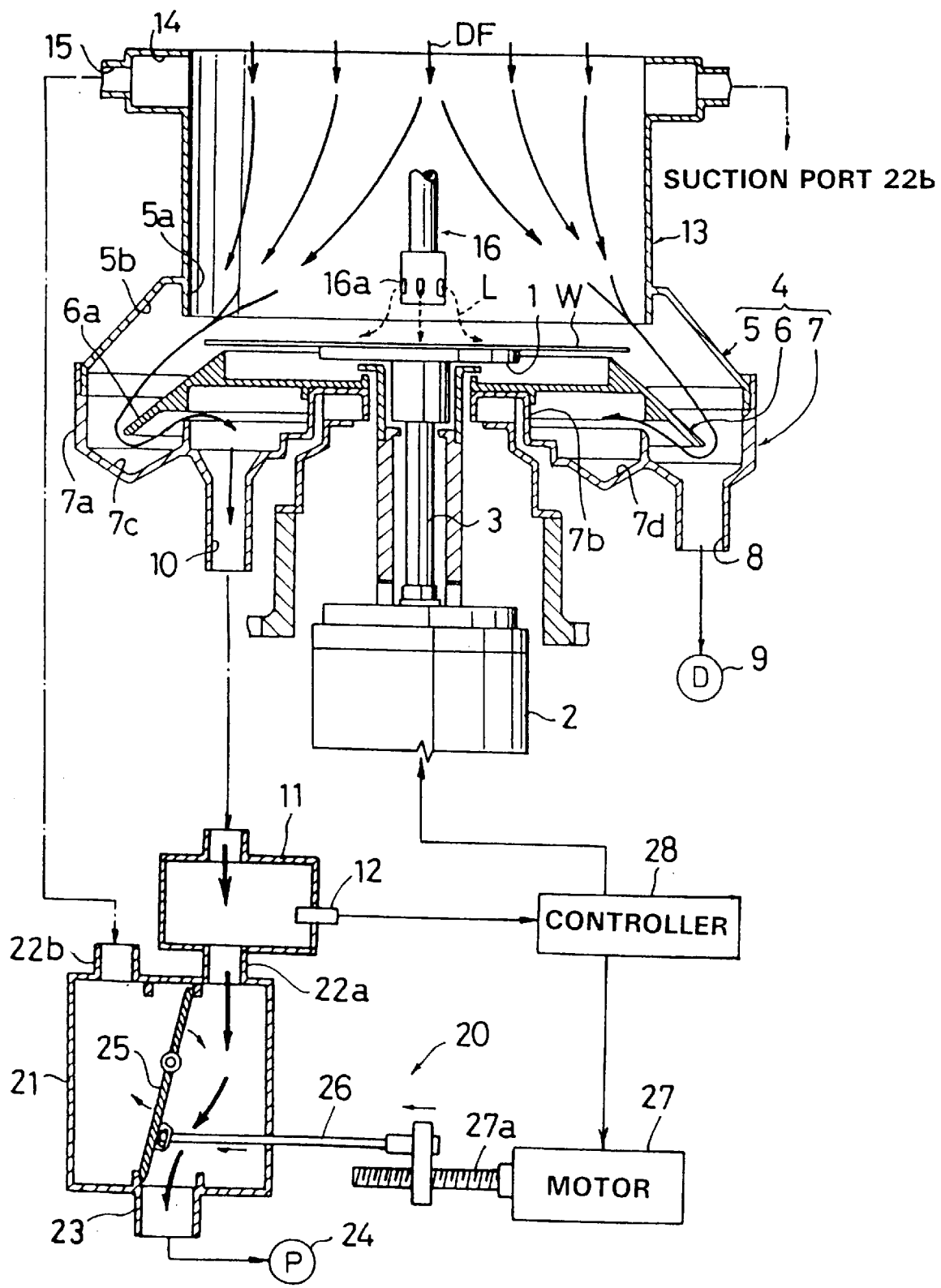
FIG. 4 is a vertical cross section of the apparatus prior to adjustment of an exhaust flow rate.

The controller 28 determines that the substrate W is suction-supported by the spin chuck 1, through a pressure detector, not shown, for detecting a pressure inside the hollow rotary shaft 3. Then, the controller 28 rotates the rotary motor 2 at a point of time tS, to attain a predetermined rotating rate R1 (e.g. a low rotating rate in the order of 10 to 50 rpm) at a point of time $t_1$. The controller 28 also starts delivery of developer L through the developer dispensing nozzle 16 at the point of time $t_S$. FIG. 4 shows the apparatus in this state. Downflows DF drawn from inside the clean-room toward the upper opening of the scatter preventive cup 4 descend inside the cylindrical wall 13, and pass around the edge of substrate W into the exhaust zone 7d to be exhausted through the cup's exhaust ports 10. Mist and particles floating in the scatter preventive cup 4 are exhausted as entrained by these gas flows, without contaminating the substrate W. The rotary motor 2 is controlled to maintain the rotating rate R1 until a point of time $t_2$, and to stop rotating at a point of time $t_E$. The supply of developer L is also stopped at the point of time $t_E$.

Figure 5:
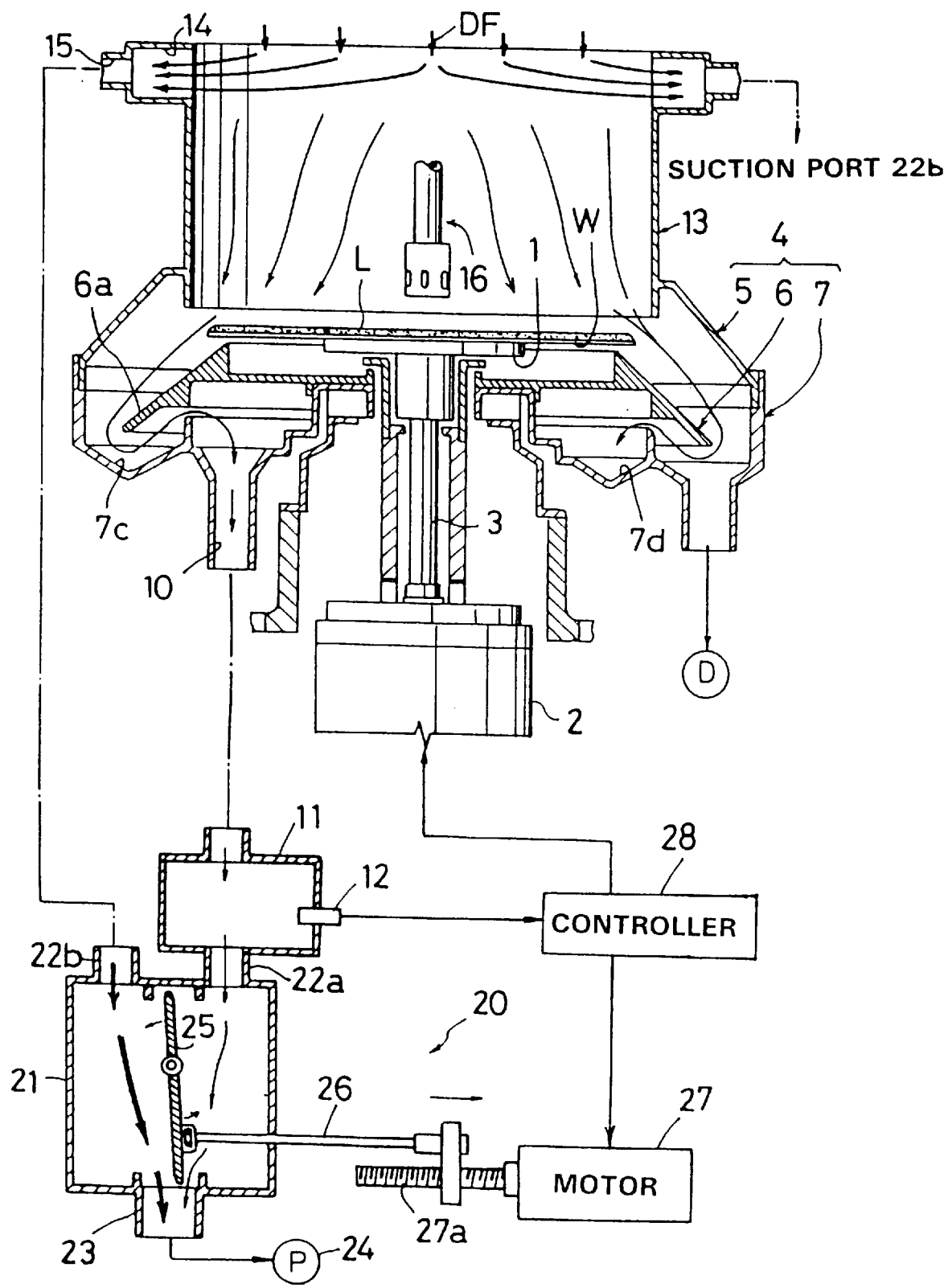
FIG. 5 is a vertical cross section of the apparatus with a reduced exhaust flow rate.

The developer L is now spread over the entire surface of substrate W and retained thereon as shown in FIG. 5. The developer L supplied is lower in effectiveness in peripheral regions than in the central region of substrate W. This is because the developer L supplied to the central region of substrate W is spread toward the edge thereof, while in contact with the photoresist film on the substrate surface, by subsequently supplied parts of the developer L. The developer L undergoes a chemical reaction to a certain extent when contacting the photoresist film. On the other hand, the central region continues to receive a fresh supply of developer L having a high degree of activity. Thus, the activity of developer L spread over the substrate W gradually lowers from the central region toward peripheral regions of substrate W, whereby the developing rate gradually lowers toward the peripheral regions.

Substantially at the point of time tE when the rotary motor 2 stops rotating, the controller 28 rotates the motor 27 to swing the swing plate 25 counterclockwise as shown in FIG. 5. The swing plate 25 is swung under feedback control to maintain the pressure detected by the manometer 12 at a negative pressure P2 (e.g. −2 mm $H_2O$) less than the fixed pressure P1, that is to cause the gas to flow out of the cup's exhaust ports 10 at a lower flow rate than when the developer L is supplied. As a result of this control, large parts of downflows DF to the scatter preventive cup 4 flow through the upper exhaust ports 15 on the cylindrical wall 13 and through the intake port 22b to be exhausted through the exhaust port 23. Parts of the downflows not exhausted through the upper exhaust ports 15 descend around the edge of substrate W and through the cup's exhaust ports 10 and exhaust box 11 to be exhausted through the exhaust port 23. The quantity of gas flowing down around the edge of substrate W is smaller now than before the point of time $t_E$ by which the developer L has been spread over the substrate W. As a result of lowering of the flow rate through the cup's exhaust ports 10, part of the odor of developer L ascends inside the cylindrical wall 13. However, this part of the odor is discharged through the upper exhaust ports 15 without leaking outside the scatter preventive cup 4.

The developer L spread over the entire surface of substrate W and retained thereon is cooled by the gas flowing down around the edge of substrate W and carrying away the heat of vaporization. However, since the quantity of gas flow is adjusted to be less than before the point of time $t_E$, the temperature drop is smaller than where the quantity of gas flow is unadjusted. Thus, the temperature of developer L on the surface of substrate W lowers gently from the central region toward the peripheral regions of substrate W, with a gentle temperature gradient. Consequently, the developing rate may be increased gradually and gently from the central region toward the peripheral regions of substrate W. As noted above, the developing rate due to the activity of developer L lowers gradually toward the peripheral regions. This balances with the developing rate due to the developer temperature to produce a substantially fixed developing rate from the central region to the peripheral regions of substrate W. As a result, the pattern has a substantially uniform line width from the central region to the peripheral regions of substrate W. That is, the developing process provides an improved degree of uniformity over the substrate surface.

This state is maintained until a point of time $t_3$. The developing process continues with the substrate W maintained still from the point of time tE to the point of time $t_3$ (for a period of time $T_D$). Upon lapse of period $T_D$ (at the point of time $t_3$), the controller 28 causes the motor 27 to swing the swing plate 25 clockwise, thereby to bring the pressure detected by the manometer 12 to the fixed value P1 (FIG. 4). As a result, the gas flows are exhausted through the cup's exhaust ports 10 at the original flow rate (i.e. exhausted at an increased rate), and the gas flows down around the edge of substrate W in the same quantity as before the point of time $t_E$.

As the original exhaust flow rate is reinstated, the controller 28 controls the rotary motor 2 to reach a high rotating rate R2 (e.g. 1,000 rpm) at a point of time $t_4$. With the resulting high-speed drive, the developer L covering the entire surface of substrate W is scattered around the substrate W, and deionized water is supplied from a cleaning nozzle, not shown, to terminate the developing process. Then, the deionized water is scattered from the substrate W and the latter is allowed to dry. The scattering developer L and deionized water turn into mist which could remain around the substrate W. However, as shown in FIG. 4, the mist is entrained by the downflows DF taken in from above and exhausted through the cup's exhaust ports 10. There is no possibility of the mist adhering to the surface of substrate W and causing a defective pattern. The controller 28 controls the rotary motor 2 at a point of time $t_5$ to stop rotating at a point of time $t_6$. The above series of operations completes the developing process for the substrate W.

The controller 28 operates the manometer 12 to detect the pressure inside the exhaust box 11, and maintains the exhaust flow rate constant by the feedback control based on the detected pressure. The flow rate may be maintained constant even if the developer or the like adheres to inner walls of the cup's exhaust ports 10 to reduce the sectional area thereof. Thus, the exhaust flow rate may be adjusted accurately, and an improved uniformity of development over the substrate surface may be maintained over a long period of time.

Figure 6:
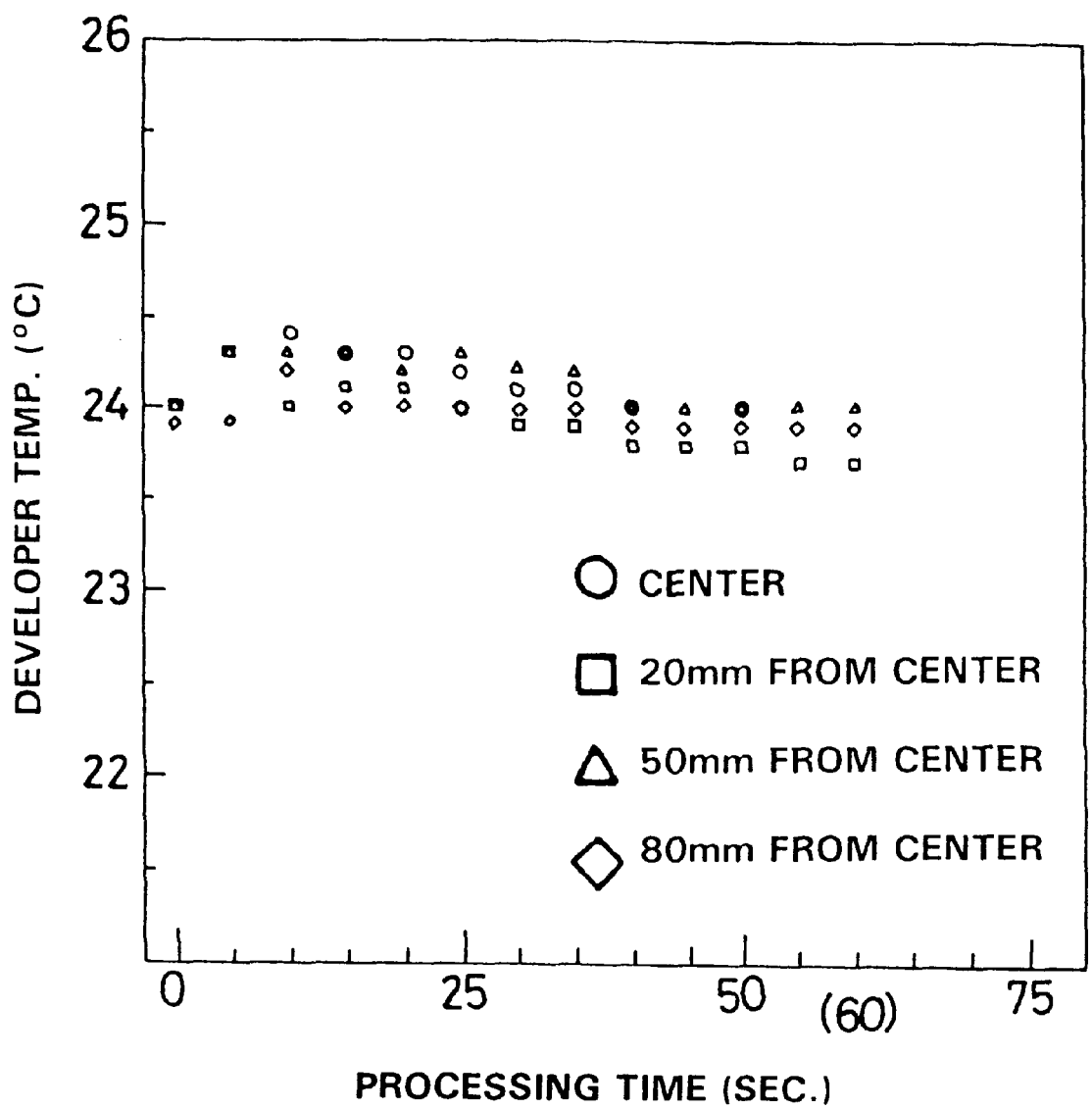
FIG. 6 is a graph showing a change, with passage of time, of developer temperature in the apparatus according to the present invention.
Figure 7:
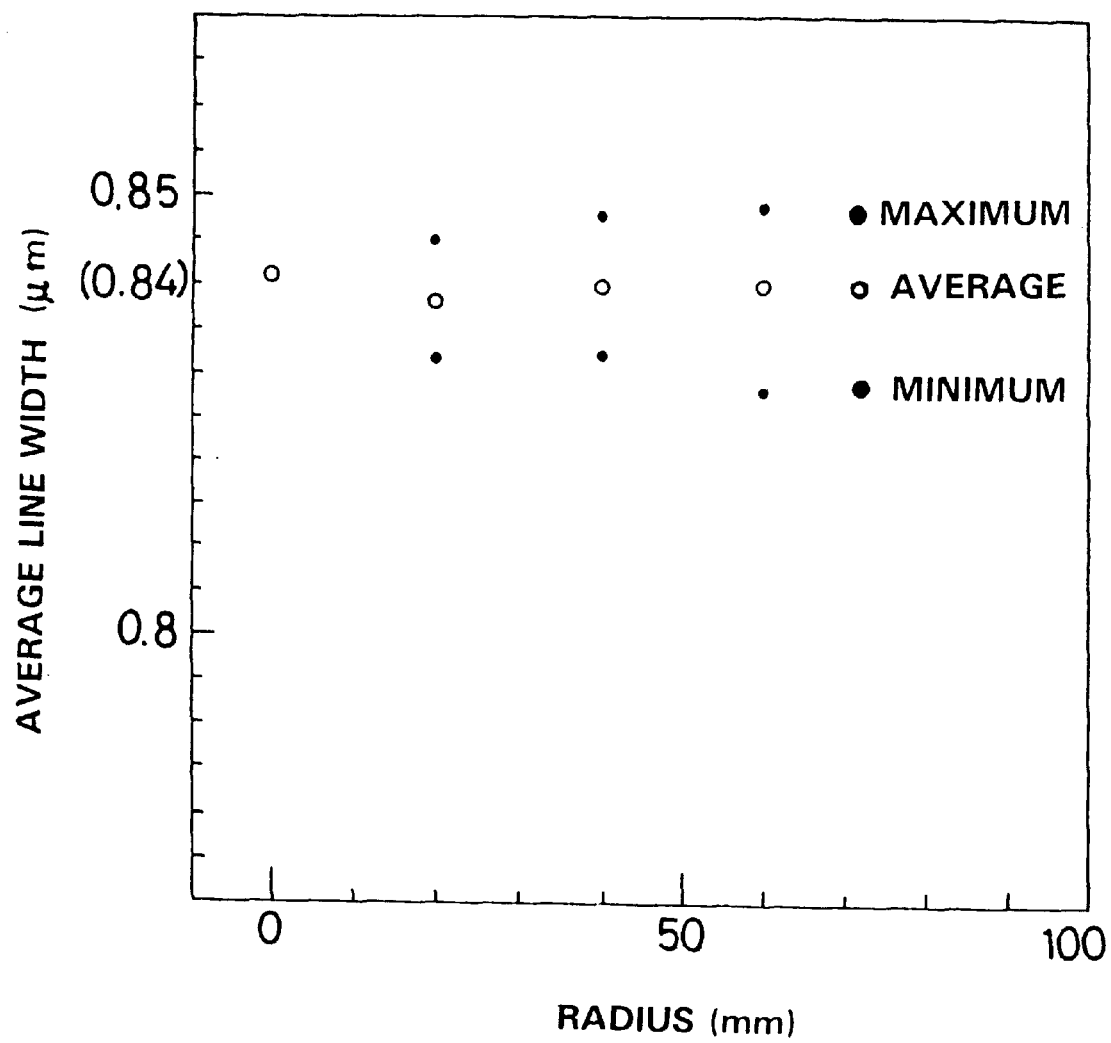
FIG. 7 is a graph showing a distribution of average line widths provided by the apparatus according to the present invention.

To confirm the effect of the apparatus embodying this invention, tests have been conducted using semiconductor wafers of 8-inch diameter. In one test, developer temperature was measured with a thermocouple at the center and at different points from center to edge of a wafer, and at different times immediately after spreading the developer over the wafer. The results are shown in FIG. 6. The above different points were three points 20 mm, 50 mm and 80 mm, respectively, from the center. In another test, a pattern with a line width (target line width) of 0.8 µm was printed, exposed and developed, and the line width was measured at the center, and at points 20 mm, 40 mm, 60 mm and 80 mm, respectively, from the center. The results of this test are shown in FIG. 7. Similar tests were conducted, for comparison, on a conventional apparatus. These tests have given developer temperatures as shown in FIG. 8, and pattern line widths as shown in FIG. 9.

Figure 8:
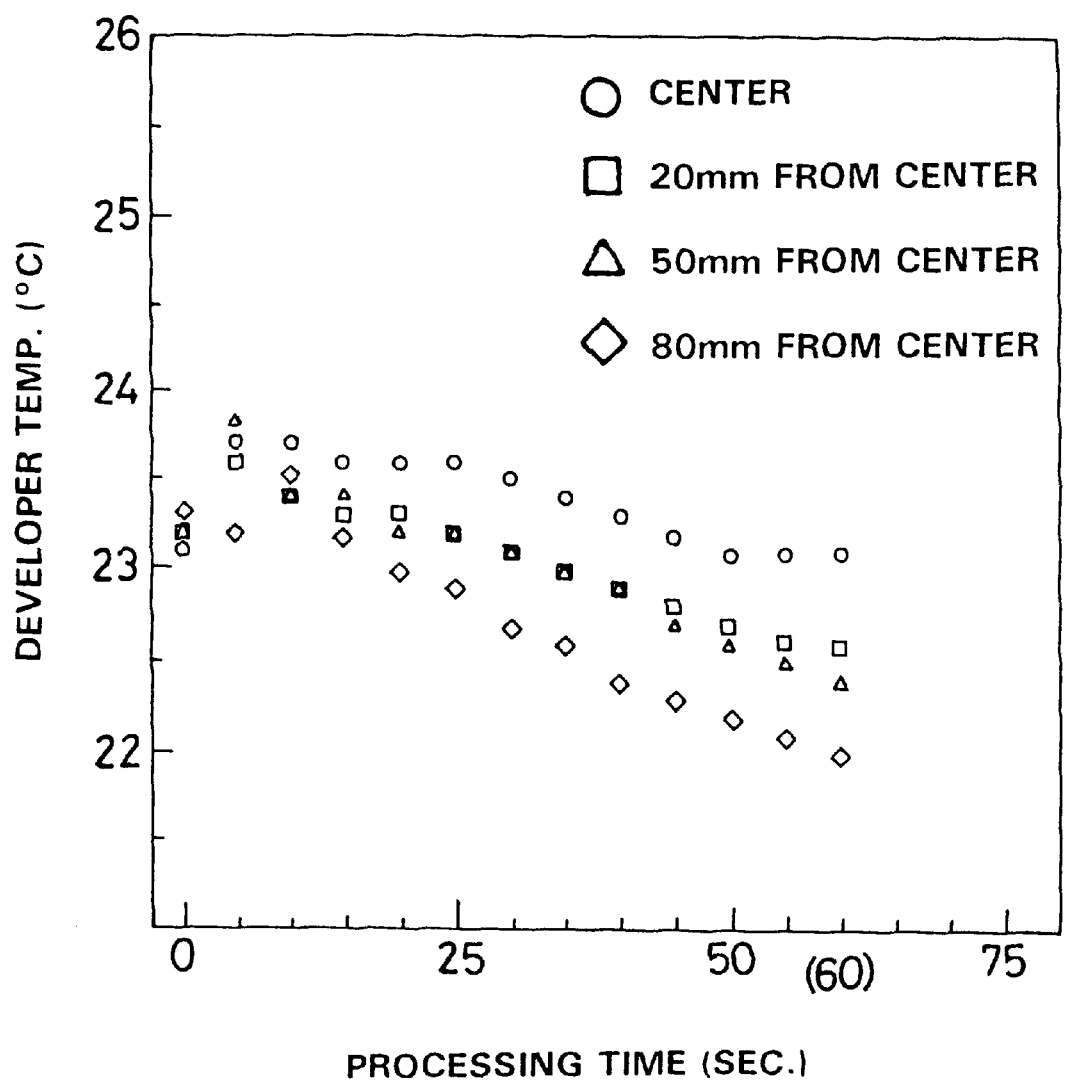
FIG. 8 is a graph showing a change, with passage of time, of developer temperature in the conventional apparatus.

Take the processing time at 60 sec. in FIGS. 6 and 8, for example. The temperature difference between the center and the point 80 mm therefrom was approximately 0.4° C. in the apparatus embodying this invention, and approximately 1.2° C. in the conventional apparatus. It will be seen that the apparatus embodying this invention provides a gentle temperature gradient from center to edge of the substrate.

Figure 9:
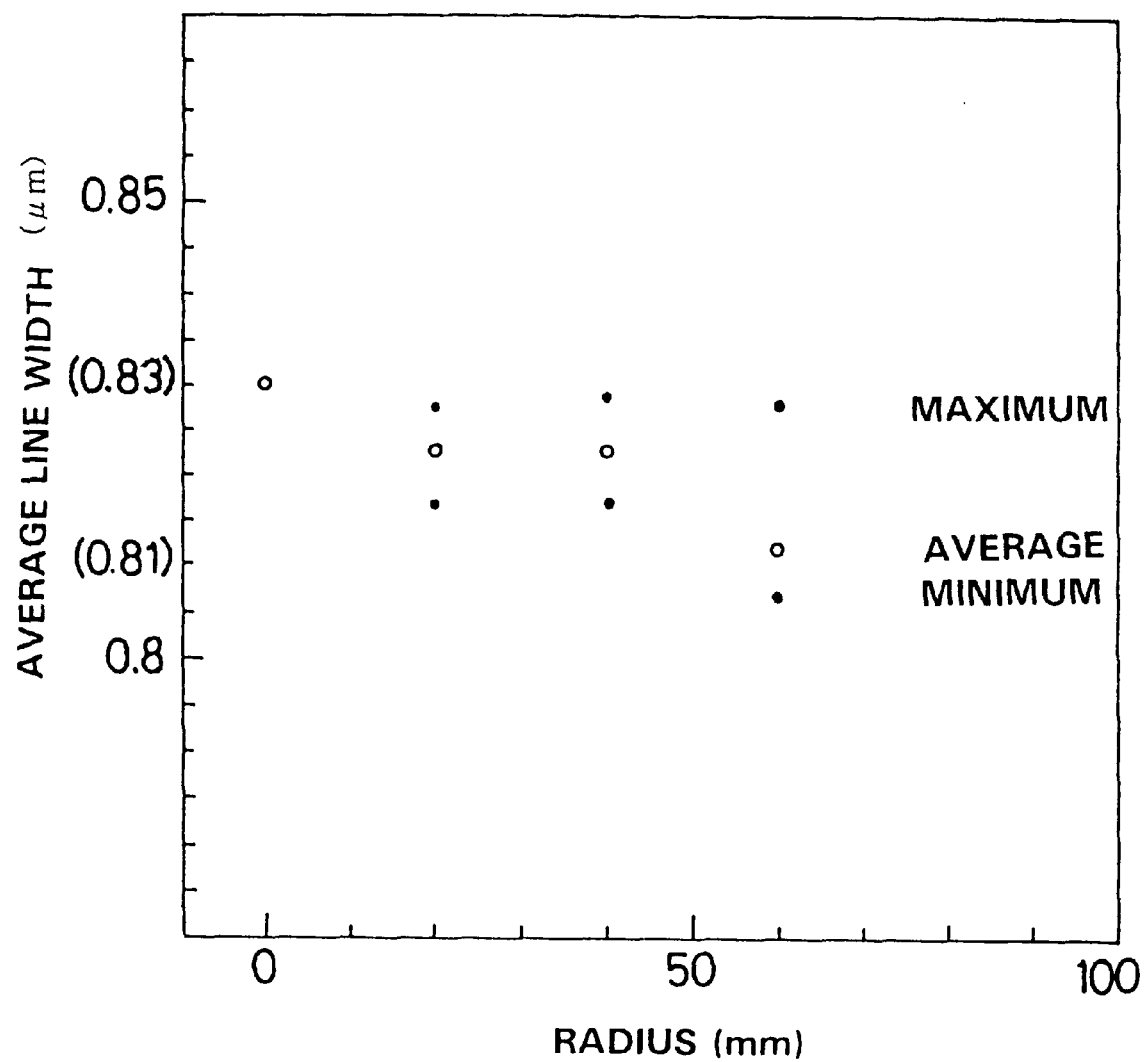
FIG. 9 is a graph showing a distribution of average line widths provided by the conventional apparatus.

Comparing average line widths in FIGS. 7 and 9, the apparatus embodying this invention provides a substantially uniform average line width of approximately 0.84 μm from the center to the point 80 mm therefrom, whereas the conventional apparatus provides an average line width of approximately 0.83 μm at the center and an average line width of approximately 0.81 μm adjacent the edge. It will be seen that, in the conventional apparatus, the line width diminishes from center to edge of the wafer. This is due to the developer temperature lowering by a considerably degree toward the edge as noted above. While the apparatus embodying this invention provides pattern line widths deviating from the target line width (0.8 μm), this may be rectified by adjusting photoresist application, exposure conditions and developing conditions.

The above comparisons show that the apparatus embodying this invention provides a substantially uniform pattern line width and improved uniformity of the developing process from center to edge of substrate W.

In the embodiment described hereinbefore, the manometer 12 is attached to the exhaust box 11. However, the manometer 12 may be disposed in any location suited to detect a pressure relating to the quantity of gas flow descending around the edge of substrate W. For example, the manometer 12 may be disposed at point A or point B in FIG. 2.

While the foregoing embodiment employs the manometer 12 as the pressure detecting device, the invention is not limited thereto but may employ a different device as long as it can detect a physical quantity relating to the quantity of gas flow descending around the edge of substrate W. For example, the manometer 12 may be replaced with an anemometer. In this case also, the anemometer may be disposed at any location noted above.

In the foregoing embodiment, the exhaust gas flow is adjusted by swinging the swing plate 25 in the box 21. This construction may be modified by providing an element in the intake port 22a intercommunicating the box 21 and exhaust box 11, the element being movable to vary a passage area in the intake port 22a. In another modification, the exhaust gas flow may be adjusted in a more direct manner by restricting the upper opening of the cylindrical wall 13.

It will serve the purpose of this invention if the exhaust gas flow is adjusted at least during the developing process with the developer spread over the surface of the substrate. For example, as shown in a two-dot-and-dash line in FIG. 3B, the exhaust gas flow may be reduced before the point of time $t_E$ at which the substrate W stops spinning, and the reduced exhaust gas flow may be maintained until when the spin of substrate W is being accelerated toward the high rotating rate R2.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate developing apparatus for developing a photoresist film formed on a surface of a substrate with a developer, said apparatus comprising:

substrate support means for supporting said substrate, which has a photoresist film on a surface thereof, substantially in a horizontal condition;

developer supply means for supplying said developer to said surface of said substrate supported by said substrate support means;

rotating means for rotating said substrate support means to remove the developer supplied onto the surface of said substrate supported by said substrate support means;

developer receiving means for receiving the developer scattered from the surface of said substrate; and flow adjusting means for adjusting quantity of a gas flow passing between an edge of said substrate supported by said substrate support means and said developer receiving means, said flow adjusting means being operable to decrease said gas flow at least during a developing process with said developer spread on said surface of said substrate.

2. A substrate developing apparatus as defined in claim 1, wherein said flow adjusting means includes:

first exhausting means for exhausting a gas including mist of said developer scattered from said substrate towards said developer receiving means;

detecting means for detecting a physical quantity relating to the quantity of said gas flow passed between an edge of said substrate supported by said substrate support means and said developer receiving means; and control means for controlling operation of said first exhausting means in accordance with a detected result of said detecting means, at least during said developing process with said developer spread on said surface of said substrate.

3. A substrate developing apparatus as defined in claim 2, wherein said control means includes, means for increasing quantity of exhaust of said first exhausting menas while said developer supply means supplies said developer to said substrate supported by said substrate support means, and for decreasing quantity of exhaust of said first exhausting means during said developing process with said developer spread on said surface of said substrate.

4. A substrate developing apparatus as defined in claim 2, further comprising second exhausting means for exhausting a gas including mist of said developer scattered from said substrate upwardly.

5. A substrate developing apparatus as defined in claim 4, wherein said control means is operable to decrease a quantity of exhaust through said second exhausting means when increasing said quantity of exhaust through said first exhausting means, and to increase said quantity of exhaust through said second exhausting means when decreasing said quantity of exhaust through said first exhausting means.

6. A substrate developing apparatus as defined in claim 5, further comprising:

a common box included by both of said first and second exhausting means, said common box being connected to a single exhaust pump; and a swing plate provided in said common box, said swing plate being controllable by said control means for increasing said quantity of exhaust through one of said first and second exhausting means to decrease said quantity of exhaust through the other.

7. A substrate developing apparatus as defined in claim 2, wherein said detecting means comprises a pressure sensor for detecting a pressure of said gas flowing down around said edge of said substrate.

8. A substrate developing apparatus as defined in claim 7, wherein said pressure sensor comprises a manometer disposed in the flow passage extending from said cup exhaust structure.

9. A substrate developing apparatus as defined in claim 2, wherein said detecting means comprises an anemometer for detecting a velocity of said gas flowing down around said edge of said substrate.

* * * * *